United States Patent [19]

Konuma et al.

[11] Patent Number: 5,576,231
[45] Date of Patent: Nov. 19, 1996

[54] PROCESS FOR FABRICATING AN INSULATED GATE FIELD EFFECT TRANSISTOR WITH AN ANODIC OXIDIZED GATE ELECTRODE

[75] Inventors: Toshimitsu Konuma; Akira Sugawara; Takahiro Tsuji, all of Kanagawa, Japan

[73] Assignee: Semiconductor Energy Laboratory Co., Ltd., Kanagawa-ken, Japan

[21] Appl. No.: 460,775

[22] Filed: Jun. 2, 1995

Related U.S. Application Data

[62] Division of Ser. No. 328,826, Oct. 25, 1994.

[30] Foreign Application Priority Data

Nov. 5, 1993 [JP] Japan ..................................... 5-301173

[51] Int. Cl.$^6$ ................................................. H01L 21/336
[52] U.S. Cl. .............................. 437/41; 437/21; 437/186; 437/238; 437/239
[58] Field of Search ................................ 437/186, 21, 40, 437/41, 239, 238

[56] References Cited

U.S. PATENT DOCUMENTS 3,806,778  4/1974  Shimakura et al. ..................... 257/406
4,742,025  5/1988  Ohyu et al. ............................. 437/225
5,289,030  2/1994  Yamazaki et al. ...................... 257/410
5,308,998  5/1994  Yamazaki et al. ...................... 257/57
5,403,762  4/1995  Takemura ............................... 437/913

FOREIGN PATENT DOCUMENTS 6-196500  7/1994  Japan .............................. 437/40 TFT Primary Examiner—Mary Wilczewski
Attorney, Agent, or Firm—Sixbey, Friedman, Leedom & Ferguson; Gerald J. Ferguson, Jr.; Bradley D. Blanche

[57] ABSTRACT

A thin film transistor comprising a gate electrode offset from source and drain, which comprises a substrate having thereon a gate electrode fabricated on an active region provided on the substrate, wherein, an anodic oxide of the material constituting the gate electrode is provided on the side and the upper face of said gate electrode, and the anodic oxide on the side of the gate electrode is formed thicker than the anodic oxide formed on the upper face. Also claimed is a process for fabricating the above thin film transistor improved in device characteristics and product yield, which comprises forming a gate electrode with an anodically oxidizable material having thereon a masking material, providing a relatively thick porous anodic oxide film on the side of the gate electrode by anodic oxidation effected under a relatively low voltage, then forming a dense anodic oxide film on at least the upper face of the gate electrode after removing the masking material, and introducing impurities into the semiconductor layer using the gate electrode portion having thereon the anodic oxide films as a mask.

9 Claims, 6 Drawing Sheets

PROCESS FOR FABRICATING AN INSULATED GATE FIELD EFFECT TRANSISTOR WITH AN ANODIC OXIDIZED GATE ELECTRODE This is a Divisional application of Ser. No. 08/328,826, filed Oct. 25, 1994.

BACKGROUND OF THE INVENTION

1. Industrial Field of the Invention

The present invention relates to a structure of a thin film insulated gate field effect transistor, i.e., a so-called thin film transistor (TFT), and to a process for fabricating the same.

2. Prior Art

In a thin film device such as an insulated gate field effect transistor of a thin film type, i.e., a TFT, it is well known that the leak current between the source and the drain can be reduced by establishing the gate electrode, the source region, and the drain region offset from each another.

In the structure comprising the gate electrode, the source region, and the drain region in an offset state, the width of offset must be controlled with a high precision in the order of less than a submicron. For instance, a fluctuation in the offset width of 0.5 μm or more is known to greatly change the characteristics of the resulting TFT. Accordingly, it is required in the fabrication of a TFT to control the offset length within a precision that an error is 0.1 μm or less, and preferably, within a higher precision that an error is 500 Å or less. Such a highly precise control in the offset width no longer can be achieved in the step of photolithography.

To overcome the problem above, a process as disclosed in Japanese patent application No. 3-237100 is proposed. The process comprises forming a gate electrode by using a material capable of being anodically oxidized, forming an anodic oxide at a thickness of 0.5 μm or less with a precision that an error is 100 Å or less around the gate electrode by anodic oxidation, and introducing an impurity by such processes as ion doping or ion implantation into the structure using the anodic oxide as the mask. Thus is established a structure with an offset state.

A known thin film device comprising the anodic oxide formed by a process above is shown in FIGS. 2(A) to 2(E). Typical structures are shown in FIGS. 2(A) and 2(C). FIG. 2(E) shows the upper view of the TFT. FIG. 2(A) is the cross section view along line A–A' of FIG. 2(E), i. e., the cross section view perpendicular to the gate electrode, and FIG. 2(C) is the cross section view along line B–B' of FIG. 2(E), i.e., the cross section view along a plane in parallel with the gate electrode.

Referring to FIG. 2(A), an island-like semiconductor coating 24 comprising an active region (a channel forming region) and impurity regions (source and drain) is provided on the substrate 22 having thereon a base insulating film 23. A gate insulating film 25 is provided further thereon. A gate electrode 26 surrounded by an anodic oxide 27 from the upper plane and the side planes is provided on the gate insulating film.

As mentioned in the foregoing, the impurity region (the hatched portion in the figure) can be provided offset from the gate electrode for a distance corresponding to the thickness x of the anodic oxide because the impurities are introduced into the semiconductor film 24 after anodically oxidizing the surrounding of the gate electrode. Thus, it can be seen that the anodic oxide on the side of the gate electrode is required for establishing the gate electrode offset from the impurity regions. The anodic oxide provided on the upper plane is necessary to surely insulate the interconnection of the gate electrode from the upper interconnection. Thus, a dense and pore-free anodic oxide having a high resistivity must be established.

In general, the leak current decreases with increasing offset length. An anodic oxide having a thickness of 0.2 μm or more, and preferably, 0.4 μm or more is required to obtain a sufficiently low leak current.

However, such a thick anodic oxide can only be obtained by applying a sufficiently high voltage for anodic oxidation. Conventionally, a voltage as high as 400 V or even higher was necessary for the anodic oxidation to form a pore-free anodic oxide having a thickness of 0.4 μm. When such a high voltage is applied, however, a part of the applied voltage is loaded between the semiconductor film 24 and the gate electrode 26 as to cause the gate insulating film 25 to undergo permanent breakdown or to increase the density of states at the boundary. Thus, prior art devices were often found to result with low product yield and poor reliability.

In case the gate electrode is made of, for instance, aluminum, an anodic oxide having a thickness of 0.4 μm is obtained by oxidizing an aluminum film having a thickness of about 0.2 μm. This signifies that the aluminum film which is provided as the gate electrode should have a thickness of 0.2 μm or more, and preferably, a thickness of 0.4 μm or more. For instance, if an initial aluminum film is provided at a thickness of 0.4 μm, and if an anodic oxide is formed thereafter at a thickness of 0.4 μm, an aluminum gate electrode having 0.2 μm in thickness results as shown in FIG. 2(B). This signifies that the gate electrode together with the anodic oxide film amounts to a thickness of 0.6 μm. In general, a step height of 0.5 μm or less is required to increase the product yield. From this point of view, it can be said that the case above violates the general rule. Moreover, considering that the substantial height of the interconnection is 0.2 μm, the increased resistance impairs the characteristics of the TFT.

To the knowledge of the present inventors, the step portion 9 in FIG. 2(D) is subject to a vigorous anodic oxidation. Thus, as shown in FIG. 2(D), the interstices tend to be completely oxidized by the anodic oxidation which may sometimes lead to establish a substantial disconnection.

SUMMARY OF THE INVENTION

In the light of the aforementioned circumstances, an object of the present invention is to provide a TFT (thin film transistor) having an improved reliability, and yet, at a high product yield, by setting the maximum voltage of the anodic oxidation at a lower level in the step of anodic oxidation. Another object of the present invention is to obtain a TFT comprising a gate electrode offset from drain and source regions by at least 0.2 μm, preferably by at least 0.5 μm, which is achieved by selectively growing an anodic oxide on the side of the gate electrode, and to minimize the height of the gate electrode and the anodic oxide.

The aforementioned object of the present invention can be accomplished in one aspect by combining a porous anodic oxide and a pore-free anodic oxide. More specifically, the device according to the present invention comprises a porous anodic oxide formed on the side face of the gate electrode at a thickness of 0.2 μm or more, and preferably, 0.5 μm or more, by applying a relatively low voltage, and a highly insulating pore-free anodic oxide on the upper surface of the gate electrode. The anodic oxide on the side of the gate electrode is formed with a higher porosity than the anodic oxide formed on the upper face. The porous anodic oxide and the highly insulating pore-free anodic oxide comprise materials constituting the gate electrode.

The porous anodic oxide can be formed by effecting anodic oxidation in an aqueous solution containing from 3 to 20% of a citric acid, oxalic acid,-phosphoric acid, chromic acid, or sulfuric acid. The pore-free anodic oxide can be obtained by effecting anodic oxidation in a solution of an organic solvent such as ethylene glycol containing from 3 to 10% of tartaric acid, boric acid, or nitric acid. The pore-free anodic oxide on the upper surface of the gate electrode is preferably formed as thin as possible so long as the oxide film sufficiently insulates the gate electrode from the upper interconnection. More specifically, the pore-free anodic oxide on the upper surface of the gate electrode is provided at a thickness of 0.2 μm or less, and preferably, at a thickness of 0.1 μm or less.

To form the two different types of anodic oxide films, a porous anodic oxide is first formed with a masking material previously provided on the upper surface of the gate electrode, and a pore-free anodic oxide is formed thereafter from the upper surface of the gate electrode after removing the masking material. The masking material for use herein must resist to the voltage applied for the anodic oxidation, and specifically mentioned as a suitable masking material is, for example, polyimide. Particularly preferred is a photosensitive material such as Photoneece (a photosensitive polyimide) or AZ1350 produced by Shipley Co., Ltd., because the gate electrode can be patterned using the photosensitive material as the masking material. A photoresist such as OFPR 800/30cp produced by Tokyo Ohka Kogyo Co., Ltd., which is commonly used in an ordinary photolithography, cannot be used as it is because peeling gradually occurs on it during the formation of a porous film with progressive anodic oxidation due to its insufficiently insulating property. However, the peeling off of the film can be prevented from occurring by previously forming an anodic oxide film at a thickness of from 50 to 1,000 Å under the conditions of forming a pore-free anodic oxide before applying the resist.

The porous anodic oxide according to the present invention can be used as it is without applying any particular treatment. However, a pore-sealing treatment can be applied to the side faces of the gate electrode to improve the insulating property of the side faces. The anodic oxide thus formed may be left over to the final stage of the fabrication process, or it may be removed during the process. In particular, a porous anodic oxide of aluminum or an alloy thereof can be easily removed by etching using a mixed acid of phosphoric acid, acetic acid, and nitric acid. The porous anodic oxide alone is removed by etching, while silicon oxide, silicon, and the pore-free anodic oxide are left intact. Although aluminum or an alloy thereof is subject to etching, the gate electrode according to the present invention is left without being damaged because its upper face and the side faces are covered with a pore-free anodic oxide. However, if the pore-free anodic oxide is provided too thinly, the gate electrode is also subject to etching. Accordingly, the pore-free anodic oxide must be provided at a thickness of 200 Å or more. An exemplary thin film transistor comprises:

an active region provided on a substrate; and a gate electrode provided on the active region.

In accordance with an aspect of the present invention, such a thin film transistor further comprises a porous anodic oxide provided on a side face of the gate electrode such that the region of the active region into which at least one type of impurity is introduced is determined either directly or indirectly by the porous anodic oxide.

DETAILED DESCRIPTION OF THE PRESENT INVENTION

Figure 1A:
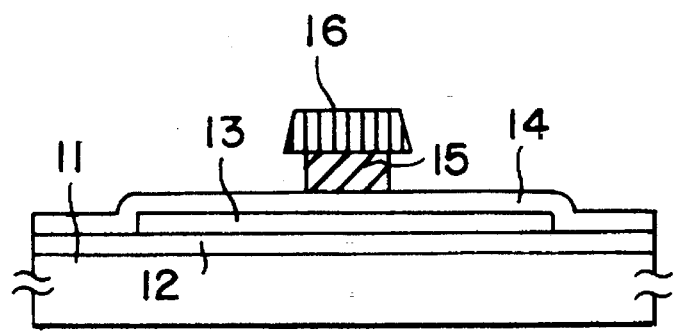
FIGS. 1(A) to 1(E) show the step-sequential schematically drawn views for the structures obtained during fabricating a TFT according to an embodiment of the present invention.
Figure 1B:
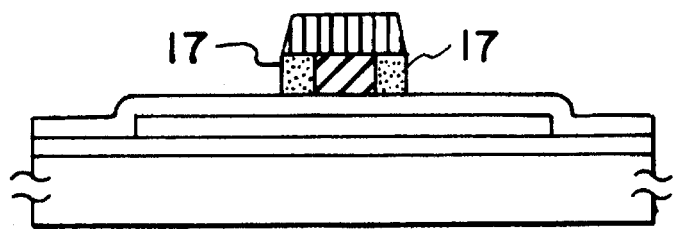
Figure 1C:
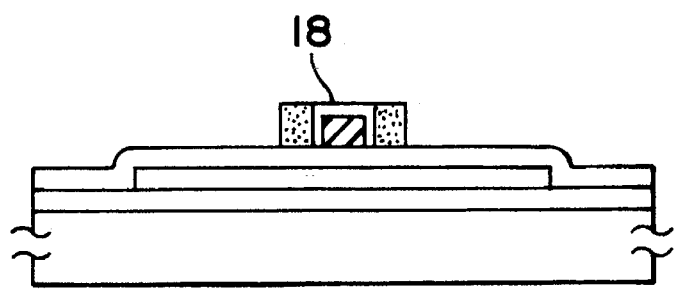
Figure 1D:
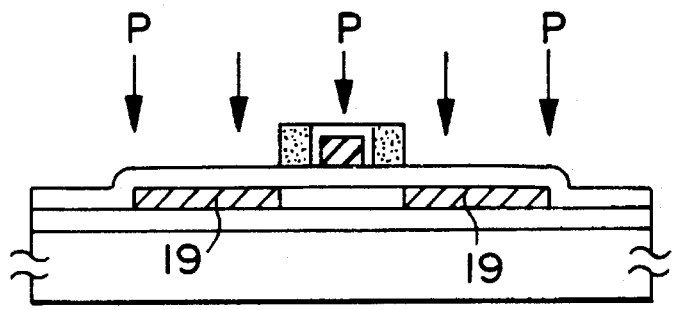
Figure 1E:
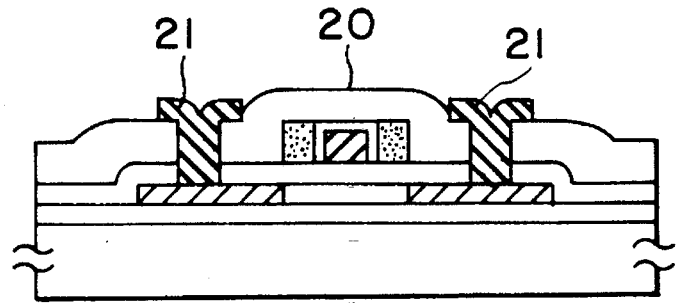
Figure 2A:
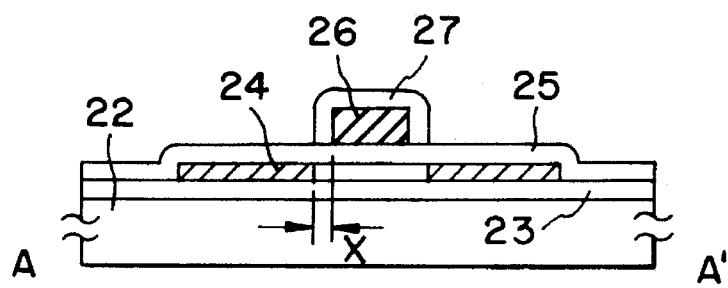
FIGS.2(A) and 2(C) are cross-sectional views in different planes showing a prior art TFT.
Figure 2B:
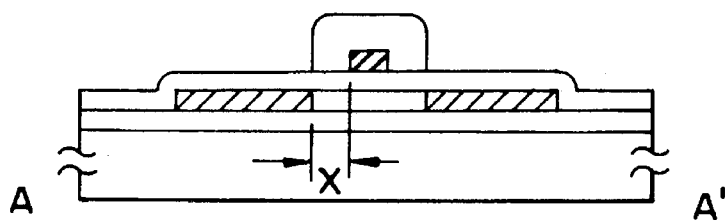
FIGS. 2(B) and 2(D) are cross-sectional views in different planes showing another prior art TFT.
Figure 2C:
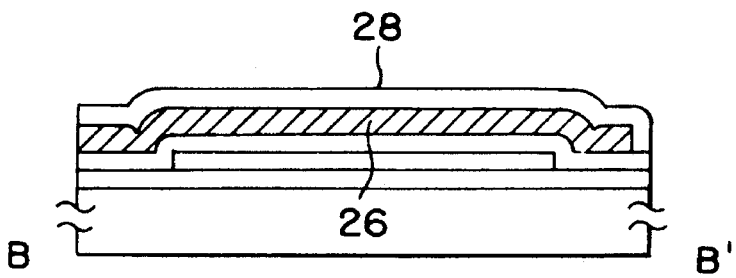
Figure 2D:
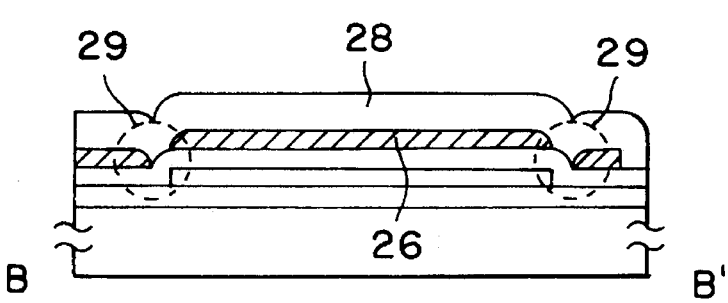
Figure 2E:
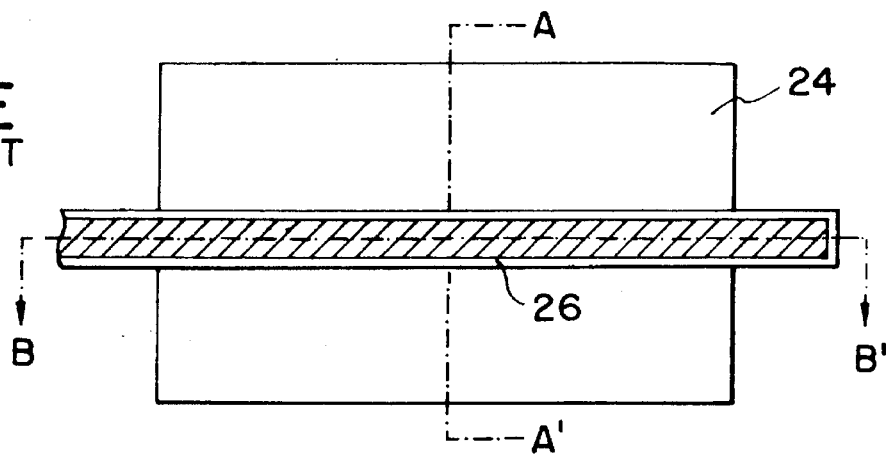
FIG. 2(E) is a plan view of the prior art TFTs shown in FIGS.2(A) to 2(D)

The present invention is described in further detail below referring to the preferred embodiments according to the present invention. It should be understood, however, that the present invention is not to be construed as being limited to the examples below.

EXAMPLE 1

Referring to FIGS. 1(A) to 1(E), a process for fabricating a TFT according to an embodiment of the present invention is described below. A 2,000 Å thick silicon oxide as a base film 12 was deposited on a Corning 7059 substrate 11 by sputtering. Then, an intrinsic (I-type) amorphous silicon film was deposited thereon at a thickness of from 500 to 1,500Å by means of plasma CVD. More specifically, the I-type amorphous silicon film was deposited at a thickness of 1,500 Å in this case. A silicon oxide film was further deposited at a thickness of 200 Å by sputtering on the amorphous silicon film.

The thus deposited amorphous silicon film was crystallized by annealing it in nitrogen atmosphere at 550° C. for a duration of 4 hours. After the annealing, the resulting silicon film was patterned to form an island-like silicon region 13, and a 1,000 Å thick silicon oxide film 14 was, deposited thereafter by means of sputtering to provide a gate insulating film. The sputtering was effected using silicon oxide as the target, while heating the substrate at a temperature in the range of from 200° to 400° C., for instance, at 250° C. The atmosphere during the sputtering was controlled as such to contain argon and oxygen at an argon to oxygen ratio of 0.5 or lower. More specifically, the sputtering in this case was effected in an atmosphere containing argon at a ratio with respect to oxygen of 0.1 or lower.

Subsequently, an aluminum film containing from 1 to 3% of silicon was deposited by sputtering to a thickness of from 3,000 to 5,000 Å. More specifically, in this case, the aluminum film containing silicon was deposited at a thickness of 4,000 Å. Preferably, the deposition of the aluminum film is effected continuously after that of the silicon oxide film. A photoresist having a favorable resistance against breakdown, such as a photoresist AZ1350 produced by Shipley Co., Ltd., was applied at a thickness of about 1 μm to the surface of the aluminum film by means of spin coating. Then, the gate electrode 15 was patterned by a known process of photolithography. Thus, a mask 16 made of a photoresist remained on the gate electrode. A similar effect can be obtained by applying a photosensitive organic material, e.g. a photosensitive polyimide (Photoneece) such as UR3800 produced by Toray Industries, Inc.

The substrate was then immersed into an aqueous of 10% citric acid solution, and anodic oxidation was effected by applying a constant voltage in a range of from 10 to 50 V for a duration of from 10 to 50 minutes. More specifically, for instance, the anodic oxidation can be effected at a constant voltage of 10 V for a duration of 30 minutes. In this manner, a porous anodic oxide 17 was deposited on the side of the gate electrode at a thickness of about 3,000 Å with a precision of 200 Å or higher. Otherwise, the anodic oxidation can be effected in an aqueous of 8% oxalic acid solution by applying a voltage in a range of from 30 to 40 V. Substantially no anodic oxidation was found to proceed on the upper side of the gate electrode because a masking material was provided thereto (FIG. 1(B)).

Then, the upper surface of the gate electrode was exposed by removing the masking material therefrom. The substrate was immersed into an ethylene glycol solution containing 3% tartaric acid and having a pH value being controlled in the neutral region by using ammonia. Thus, anodic oxidation was effected by applying a current in such a manner that the voltage may be increased to 120 V at a rate of from 1 to 5 V/min, for example, at a rate of 4 V/min. Anodic oxidation was found to occur not only on the upper face of the gate electrode, but also on the side faces of the gate electrode to form a dense pore-free anodic oxide 18 at a thickness of 1,000 Å. However, anodic oxidation may occur only on the upper face of the gate electrode. The withstand voltage of the anodic oxide was found to be 50 V or higher (FIG. 1(C)).

Then, phosphorus was implanted as an impurity into a silicon region 13 by plasma doping using the gate electrode as a mask. Thus, phosphorus was incorporated into the silicon region 13 at a dose of from $1\times10^{15}$ to $8\times10^{15}$ cm$^{-2}$ by applying an accelerating voltage in a range of from 60 to 90 kV using phosphine (PH$_3$) as the doping gas. More specifically in this case, phosphorus was incorporated into the silicon region 13 at a dose of $2\times10^{15}$ cm$^{-2}$ by applying an accelerating voltage of 80 kV. An N-type impurity region 19 was formed in this manner (FIG. I(D)).

Then, the impurity region thus fabricated by doping was activated by laser annealing which comprises irradiating a laser beam from the upper side of the structure. A KrF excimer laser operating at a wavelength of 248 nm and at a pulse width of 30 nsec was used. However, other types of lasers, for example, a XeCl excimer laser operating at a wavelength of 308 nm, an ArF excimer laser operating at a wavelength of 193 nm, or a XeF excimer laser operating at a wavelength of 353 nm may be used as well.

The laser beam is generally emitted at an energy density of from 200 to 400 mJ/cm$^2$ and from 2 to 10 shots per site. More specifically in this case, the laser was operated at an energy density of 250 mJ/cm$^2$ to apply 2 shots of the pulsed laser beam per site. During irradiating the laser beam, the substrate was heated at the temperature range of from 200° to 300° C., for instance, at 250° C. The impurity region 19 was activated in this manner.

Then, a 6,000 Å thick silicon oxide film 20 was deposited as an interlayer dielectric by plasma CVD. Then, contact holes were provided in the silicon oxide film 20 to form an electrode with interconnection 21 for each of the source and drain regions of the TFT by using a metallic material such as a multilayered film of titanium nitride and aluminum. Finally, the resulting structure was annealed in gaseous hydrogen at a pressure of 1 atm and at a temperature of 350° C. for a duration of 30 minutes. Thus was the structure completed into a thin film transistor (FIG. 1(E)).

The porous anodic oxide 17 was left unremoved in the final structure in the process above. However, as described in the drawing, since a high voltage is applied to the boundary between the channel forming region and the source and drain 19, highly movable carriers may be generated in some cases. Then, the charges are easily trapped by the levels that are present in a considerably quantity in the porous anodic oxide. These charges that are trapped in the porous anodic oxide impair the characteristics of the resulting TFT. Accordingly, it is desired to finally remove the anodic oxide 17 to further improve the reliability of the TFT.

Figure 3:
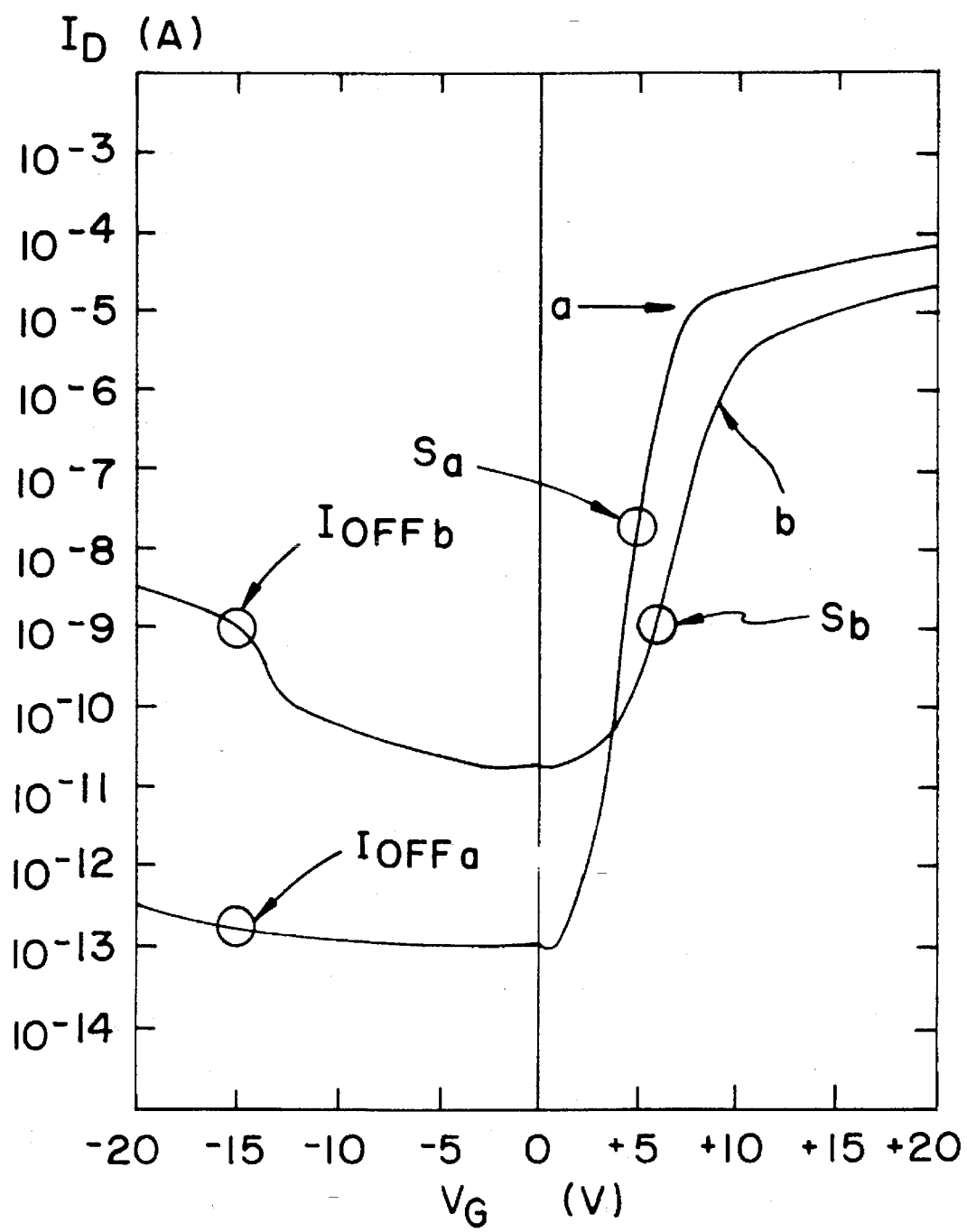
FIG. 3 is a graph showing the $V_G$-$I_D$ characteristic curves for a TFT according to the present invention and for a prior art TFT.
Figure 4A:
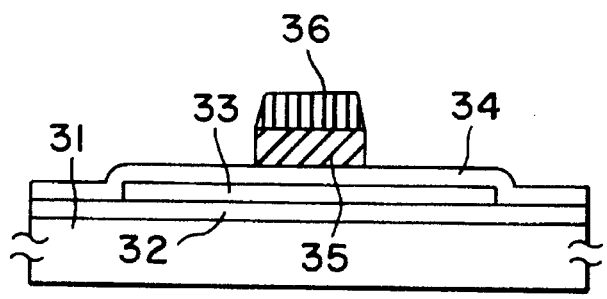
FIGS. 4(A) to 4(F) show the step-sequential schematically drawn views for the structures obtained during fabricating a TFT according to another embodiment of the present invention.
Figure 4B:
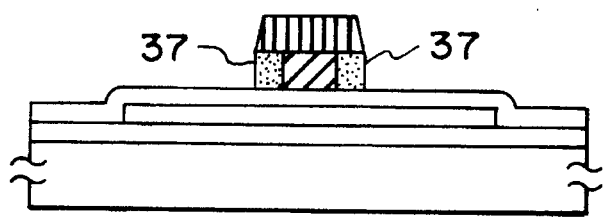
Figure 4C:
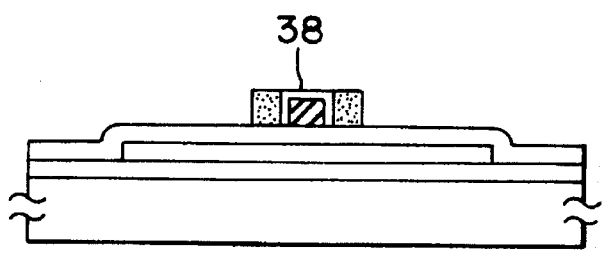
Figure 4D:
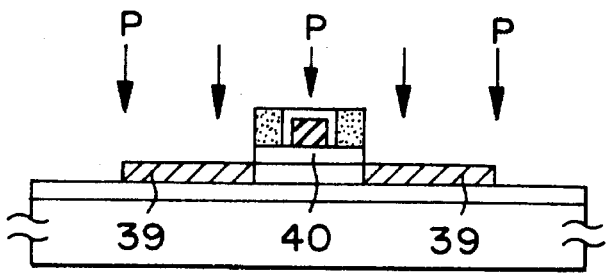
Figure 4E:
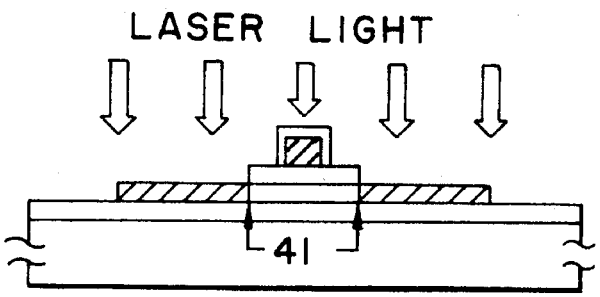
Figure 4F:
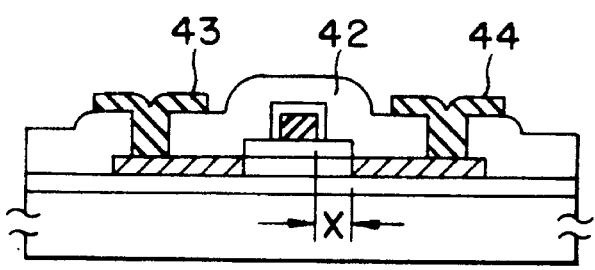
Figure 5A:
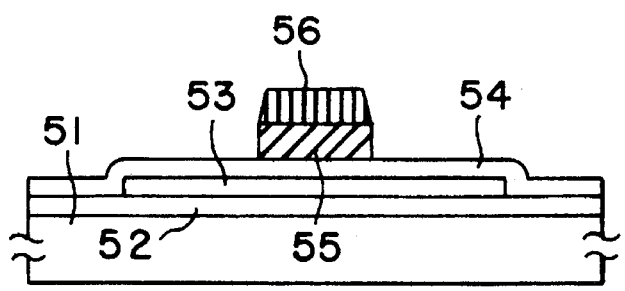
FIGS. 5(A) to 5(F) show the step-sequential schematically drawn views for the structures obtained during fabricating a TFT according to a still other embodiment of the present invention.
Figure 5B:
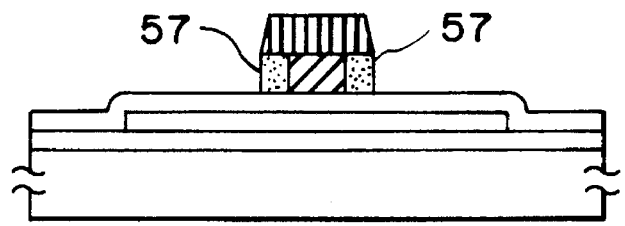
Figure 5C:
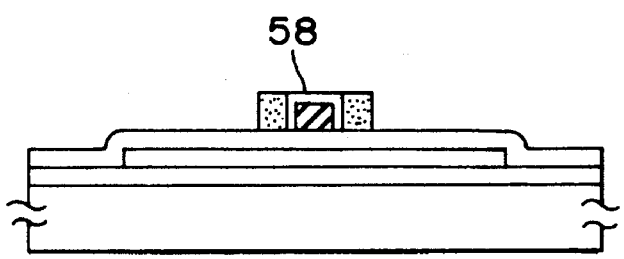
Figure 5D:
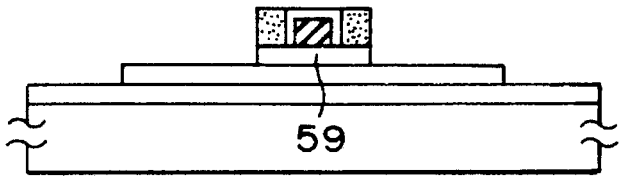
Figure 5E:
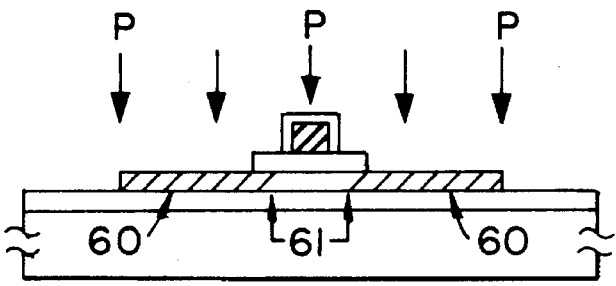
Figure 5F:
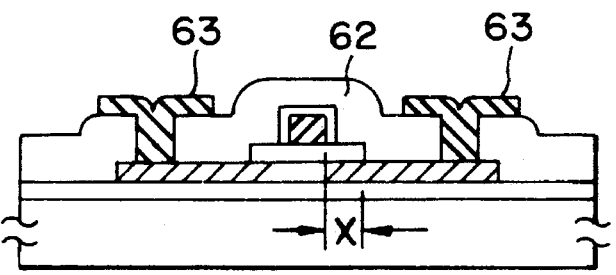

FIG. 3 is a graph in which the characteristics of a TFT obtained according to the present example is compared with that of a prior art TFT fabricated according to a process disclosed in Japanese patent application 3-237100. According to the prior art process, anodic oxidation is effected in an ethylene glycol solution containing 3% of tartaric acid (the pH thereof is adjusted to a neutral value using ammonia) by increasing the voltage to 220 V at a rate of 4 V/min. As a result, an anodic oxide was formed at a thickness of 2,000 Å with an offset of about 2,000 Å. In contrast to a prior art process, the process according to the present example yields a 3,000 Å thick porous anodic oxide and a 1,000 Å thick pore-free anodic oxide which in total result in an offset of about 4,000 Å. Thus, the TFT according to the present example results in an extremely low leak current ($1_{OFF}$). The anodic oxide on the side of the gate electrode is provided thicker than the anodic oxide formed on the upper face.

Furthermore, because an excessively high voltage is not applied to the gate insulating film on effecting the anodic oxidation, the TFT according to the present example yields a gate insulating film considerably reduced in density of states. Thus, an extremely low sub-threshold (S value) was obtained for the TFT according to the present invention as to yield a steep rise in the $V_G$-$I_D$ curve shown in FIG. 3. The deterioration of the device characteristics was further investigated for the both TFTs by applying each a bias voltage for a long duration of time. The difference in characteristics between the two TFTs was more obvious after applying a voltage of 25 V for 100 hours to the gate and drain while earthing the source. More specifically, the prior art TFT yielded a flat $V_G$-$I_D$ curve, whereas a decrease by 20% on the ON current and an increase by 30% on the leak current were merely observed to occur on the TFT according to the present example.

EXAMPLE 2

Referring to FIGS. 4(A) to 4(F), a process for fabricating a TFT according to another embodiment of the present invention is described below. A 2,000 Å thick silicon oxide as a base film 32 was deposited on a Corning 7059 substrate 31 by sputtering. Then, an intrinsic (I-type) amorphous silicon film was deposited thereon at a thickness of from 200 to 1,000 Å by means of plasma CVD. More specifically, the I-type amorphous silicon film was deposited at a thickness of 500 Å in this case. The thus deposited amorphous silicon film was patterned and etched to form island-like silicon regions 33, and was crystallized by irradiating a laser light using a KrF excimer laser. A 1,000 Å thick silicon oxide film 34 was deposited thereafter by means of sputtering to provide a gate insulating film.

Subsequently, an aluminum film containing from 0.1 to 0.3% by weight of scandium was deposited by sputtering to a thickness of from 3,000 to 8,000 Å. More specifically in this case, the aluminum film containing scandium was deposited at a thickness of 4,000 Å. A thin anodic oxide from 100 to 400 Å in thickness was formed thereafter by immersing the substrate in an ethylene glycol solution containing 3% of tartaric acid being neutralized by ammonia to yield a pH value of about 7, and applying a voltage in a range of from 10 to 30 V. A photoresist, such as OFPR 800/30cp produced by Tokyo Ohka Kogyo Co., Ltd., was applied at a thickness of about 1 µm to the surface of the aluminum film by means of spin coating. Then, a gate electrode 35 was formed by a known process of photolithography. Thus, a mask 36 made of the photoresist was left on the gate electrode (FIG. 4(A)).

The substrate was then immersed into an aqueous 10% of citric acid solution, and anodic oxidation was effected by applying a constant voltage in a range of from 5 to 50 V for a duration of from 10 to 500 minutes. More specifically, for instance, the anodic oxidation can be effected at a constant voltage of 8 V for a duration of 200 minutes. In this manner, a porous anodic oxide 37 was formed on the side of the gate electrode at a thickness of about 5,000 Å with a precision that an error is within 200 Å or less. Substantially no anodic oxidation was found to proceed on the upper side of the gate electrode because a masking material 36 was provided on the upper side of the gate electrode (FIG. 4(B)).

Then, the upper surface of the gate electrode was exposed by removing the masking material therefrom. The substrate was immersed into an ethylene glycol solution containing 3% tartaric acid having its pH value being controlled in the neutral region by using ammonia. Thus, anodic oxidation was effected by applying a current in such a manner that the voltage may be increased to 100 V at a rate of from 1 to 5 V/min, for example, at a rate of 4 V/min. Anodic oxidation was found to occur not only on the upper face of the gate electrode, but also on the side faces of the gate electrode to form a dense pore-free anodic oxide 38 at a thickness of 1,000 Å. The withstand voltage of the anodic oxide was found to be 50 V or higher (FIG. 4(C)).

The silicon oxide film 34 was etched thereafter by dry etching. The etching can be effected either isotropically in a plasma mode, or anisotropically in a reactive ion etching mode. The key in this step is to sufficiently increase the selectivity ratio of silicon to silicon oxide as to prevent deep etching from occurring on the active layer 33. By using $CF_4$ as the etching gas, the silicon oxide film alone can be etched without damaging the anodic oxide 37 and 38. After the etching, the silicon oxide film under the anodic oxide was found to be left as a gate insulating film 40.

Then, phosphorus was implanted as an impurity into the silicon region 33 by plasma doping using the gate electrode 35 and the porous anodic oxide 37 on the side face as a mask. Thus, phosphorus was incorporated into the silicon region 33 at a dose of from $\times 10^{14}$ to $8\times 10^{15}$ $cm^{-2}$ by applying an accelerating voltage in a range of from 5 to 30 kV using phosphine ($PH_3$) as the doping gas. More specifically in this case, phosphorus was incorporated into the silicon region 33 at a dose of $2\times 10^{15}$ $cm^{-2}$ by applying an accelerating voltage of 10 kV. An N-type impurity region 39 was formed in this manner (FIG. 4(D)).

Then, the porous anodic oxide 37 was etched using a mixed acid of phosphoric acid, acetic acid, and nitric acid to expose the pore-free anodic oxide 38. The impurity region thus fabricated by doping was activated by laser annealing which comprises irradiating a laser beam from the upper side of the structure. Since a laser light is irradiated to the boundary 41 between the doped impurity region and the region left undoped in this example, the generation of problematic trap levels is found to be suppressed (FIG. 4(E)).

Then, a 6,000 Å thick silicon oxide film 42 was deposited as an interlayer dielectric by plasma CVD. Then, contact holes were provided in the silicon oxide film 42 to form an electrode with interconnection 43 for each of the source and drain regions of the TFT by using a metallic material such as a multilayered film of titanium nitride and aluminum. Finally, the resulting structure was annealed in gaseous hydrogen at a pressure of 1-atom and at a temperature of 350° C for a duration of 30 minutes. Thus was the structure completed into a thin film transistor (FIG. 4(F)). The offset width x in the TFT according to the present example was about 6,000 Å, which is a total of the width of the porous anodic oxide (5,000 Å) and the thickness of the pore-free anodic oxide (1,000 Å).

EXAMPLE 3

Referring to FIGS. 5 (A) to 5 (F), a process for fabricating a TFT according to a still other embodiment of the present invention is described below. A 2,000 Å thick silicon oxide as a base film 52 was deposited on a Corning 7059 substrate 51 by sputtering. Then, an island-like intrinsic (I-type) crystalline silicon film was formed thereon at a thickness of from 200 to 1,500 Å. More specifically, the I-type crystalline silicon film was formed at a thickness of 800 Å in this case. A 1,000 Å thick silicon oxide film 54 was formed thereafter to cover the island-like crystalline silicon region 53.

Subsequently, an aluminum film containing from 0.1 to 0.3% of scandium was deposited by sputtering to a thickness of from 3,000 to 8,000 Å. More specifically in this case, the aluminum film containing scandium was deposited at a thickness of 6,000 Å. A thin anodic oxide from 100 to 400 Å in thickness was formed thereafter in the same manner as in Example 2. A photoresist was applied at a thickness of about 1 µm to the surface of the aluminum film by means of spin coating. Then, a gate electrode 55 was formed by a known process of photolithography. Thus, a mask 56 made of the photoresist was left on the gate electrode (FIG. 5(A)).

The substrate was then immersed into an aqueous 10% oxalic acid solution, and anodic oxidation was effected by applying a constant voltage in a range of from 5 to 50 V for a duration of from 10 to 500 minutes. More specifically, for instance, the anodic oxidation can be effected at a constant voltage of 8 V for a duration of 200 minutes. In this manner, a porous anodic oxide 57 was formed on the side of the gate electrode at a thickness of about 5,000 Å. Substantially no anodic oxidation was found to proceed on the upper side of the gate electrode because a masking material 56 was provided thereto (FIG. 5(B)).

Then, the upper surface of the gate electrode was exposed by removing the masking material therefrom. The substrate was immersed into an ethylene glycol solution containing 3% of tartaric acid having its pH value being controlled in the neutral region by using ammonia. Thus, anodic oxidation was effected by applying a current in such a manner that the voltage may be increased to 100 V at a rate of from 1 to 5 V/min, for example, at a rate of 4 V/min. Anodic oxidation was found to occur not only on the upper face of the gate electrode, but also on the side faces of the gate electrode to form a dense pore-free anodic oxide 58 at a thickness of 1,000 Å. The withstand voltage of the anodic oxide was found to be 50 V or higher (FIG. 5(C)).

The silicon oxide film 54 was etched thereafter by dry etching. The silicon oxide film alone was etched in this step without damaging the anodic oxide 57 and 58. After the etching, the silicon oxide film under the anodic oxide was found to be left over as a gate insulating film 59 (FIG. 5(D)).

Then, the porous anodic oxide 57 was etched using a mixed acid of phosphoric acid, acetic acid, and nitric acid to expose the pore-free anodic oxide 58. Then, phosphorus was implanted as an impurity into the silicon region 53 by plasma doping using the gate electrode 55 and the pore-free anodic oxide 58 on the side plane as a mask. Thus, phosphorus was incorporated into the silicon region 53 at a dose of from $1\times10^{14}$ to $8\times10^{15}$ cm$^{-2}$ by applying an accelerating voltage in a range of from 5 to 30 kV using phosphine (PH$_3$) as the doping gas. More specifically in this case, phosphorus was incorporated into the silicon region 53 at a dose of $2\times10^{15}$ cm$^{-2}$ by applying an accelerating voltage of 10 kV.

Thus, the region 60 remaining uncovered by the gate insulating film 59 was implanted with phosphorus at a high concentration, however, the gate insulating film 59 functioned as an obstacle in incorporating impurities into the region 61. Thus, the region 61 covered with the gate insulating film 59 was lightly doped with phosphorus at a concentration corresponding to from 0.1 to 5% of that of the region 60. An N-type heavily doped impurity region 60 and lightly doped impurity region 61 were established as a result (FIG. 5(E)).

The impurity region thus fabricated by doping was activated by laser annealing which comprises irradiating a laser beam from the upper side of the structure. Then, a 6,000 Å thick silicon oxide film 62 was deposited as an interlayer dielectric by plasma CVD. Then, contact holes were provided in the silicon oxide film 62 to form an electrode with interconnection 63 for each of the source and drain regions of the TFT by using a metallic material such as a multilayered film of titanium nitride and aluminum. Finally, the resulting structure was annealed in gaseous hydrogen at a pressure of 1 atm and at a temperature of 350° C. for a duration of 30 minutes. Thus was the structure completed into a thin film transistor (FIG. 5(F)).

A lightly doped drain (LDD) structure was thus implemented in the present example. An LDD structure is known to be effective in suppressing the deterioration attributed to hot carriers. The same effect was observed in the TFT fabricated in the present example according to an embodiment of the present invention. The process according to the present example is still advantageous as compared with the known processes, however, in that an LDD is obtained by a single step of doping. Moreover, in the TFT according to the present example, a highly doped impurity region 60 is established (determined) by utilizing the gate insulating film 59 provided (determined) by the porous anodic oxide 57. This signifies that the impurity region in the present example is finally established (determined) indirectly by the porous anodic oxide 57. As shown in the foregoing, the width x of the LDD region is determined substantially by the width of the porous anodic oxide.

According to the process for fabricating a TFT as described in the foregoing Examples 2 and 3, a still higher integrated structure can be implemented. In realizing a structure with a higher integration, the width x of the offset region or the LDD region is preferably varied according to the characteristics required for the TFT. Referring to a block diagram in FIG. 6, an electro-optical system is described below. The system comprises an integrated circuit having a display element, a CPU (central processing unit), and memories mounted on a single glass substrate.

In the system, an input port reads a signal input from the outside and converts it into an image signal, and a correction memory is provided as an inherent memory for the panel to correct the input signal and the like in accordance with the characteristics of the active matrix panel. In particular, the correction memory stores the information inherent to each of the pixels in a non-volatile memory to correct the signal independently for each of the pixels. More specifically, in case a point defect is found in a pixel of the electro-optical device, correction signals are sent to the pixels around the defective pixel to compensate for the defect. In case a pixel is found to be darker than the surrounding pixels, a more intense signal is sent to the pixel under consideration to make the pixels yield a uniform brightness.

The CPU and the memories mounted in the system are the same as those used in an ordinary computer. In particular, the memory comprises an image memory corresponding to each of the pixels as a RAM (random access memory). Furthermore, the intensity of the backlight for lighting the substrate from the back can be varied according to the image information.

Figure 6:
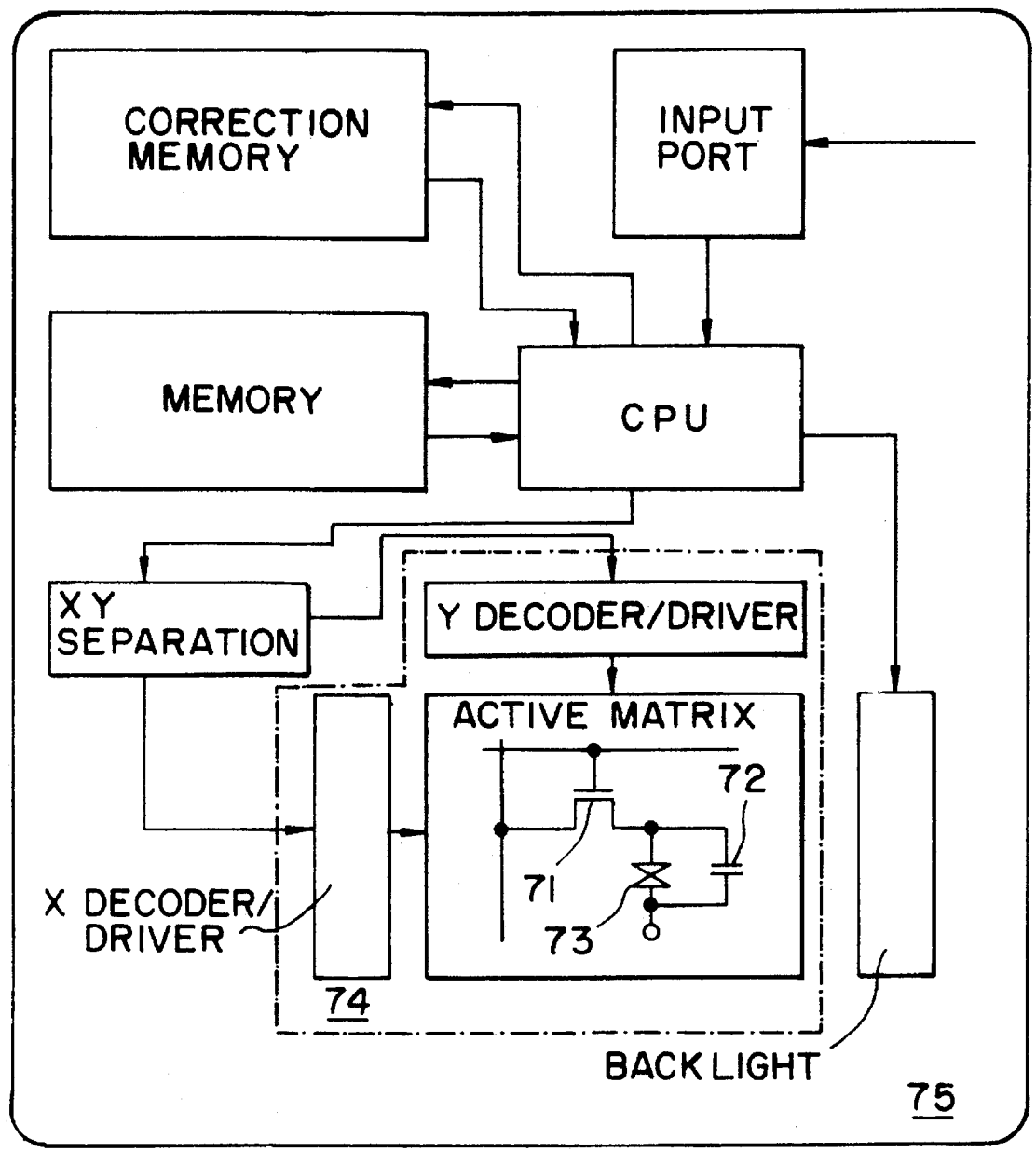
FIG. 6 is a block diagram of an integrated circuit according to an embodiment of the present invention.

An offset region or an LDD region can be provided with an optimal width according to each of the circuits by individually setting the condition of anodic oxidation. This can be realized by establishing separately from 3 to 10 interconnecting lines. In an active matrix circuit, a channel with a length of 10 μm and an LDD region with a width in a range of from 0.4 to 1 μm, specifically at 0.6 μm, are set typically. An N-channel TFT driver typically comprises a channel with a length of 8 μm and a width of 200 μm, and an LDD region having a width of from 0.2 to 0.3 μm, for example, 0.25 μm. A typical P-channel TFT driver comprises a channel with a length of 5 μm and a width of 500 μm, and an LDD region having a width of from 0 to 0.2 μm, for example, 0.1 μm. In case of a decoder, an N-channel TFT is typically provided with a channel having a length of 8 μm and a width of 10 μm, and an LDD region having a width of from 0.3 to 0.4 μm, for example, 0.35 μm, whereas a P-channel TFT is provided with a channel having a length of 5 μm and a width of 10 μm, and an LDD region having a width of from 0 to 0.2 μm, for example, 0.1 μm. Referring to FIG. 6, the width of the LDD region for the N-channel and P-channel TFTs of the CPU, input port, correction memory, and the memory is set optimally in the same manner as in a high-frequency low-power decoder. Thus is obtained an electro-optical device 74 on a single substrate having an insulating surface.

In the present invention, the width of the high resistance region is set variable in two to four types, or even more, according to the use. Furthermore, the high resistance region in the device according to the present invention need not to be the same material nor to be the same conductive type as that of the channel forming region. More specifically, a trace amount of an N-type impurity may be added in case of an N-channel TFT, or a trace amount of a P-type impurity may be added in a P-channel TFT. Otherwise, carbon, oxygen, nitrogen, and the like can be incorporated selectively to form a high resistance region. At any rate, these means are effective for improving the reliability, frequency characteristics, and off-current properties that are trade-offs for the degradation attributed to the generation of hot carriers.

As described in detail in the foregoing examples, a TFT according to the present invention is far improved in both reliability and device characteristics. Moreover, the generation of pinholes and disconnection is greatly reduced because the height of the gate electrode and the anodic oxide is suppressed to a certain value. Furthermore, no disconnection occurs on the gate lines during the anodic oxidation. Conclusively, the TFTs can be fabricated at a high product yield. It can be seen therefore that the present invention is greatly contributory to the industry.

While the invention has been described in detail and with reference to specific embodiments thereof, it will be apparent to one skilled in the art that various changes and modifications can be made therein without departing from the spirit and scope thereof.

What is claimed is:

1. A process for fabricating a thin film transistor comprising:
   a first step of forming a gate insulating film on the surface of an active region formed on the substrate;
   a second step of forming a first coating which is capable of being anodically oxidized on the gate insulating film, and forming further on said first coating a second coating which provides a masking material;
   a third step of patterning said first and said second coating to form a gate electrode and the masking material on said gate electrode;
   a fourth step of forming an anodic oxide on a side of the gate electrode with the masking material by applying a current to said gate electrode;
   a fifth step of applying a current to the gate electrode to form an anodic oxide on at least an upper side of the gate electrode after removing the masking material; and
   a sixth step of introducing an impurity into the active region by using the anodic oxide and the gate electrode obtained in at least one of the fourth and fifth step above as the masks.

2. The process of claim 1 wherein the first coating is made of an electrically conductive material comprising aluminum.

3. The process of claim 1 wherein the second coating is made of a light-sensitive organic material.

4. The process of claim 1 wherein after forming the first coating, the surface of the first coating is oxidized in the second step.

5. The process of claim 1 wherein the anodic oxide formed mainly by effecting the fourth step is removed after the sixth step.

6. The process of claim 1 wherein said gate electrode comprises aluminum and scandium.

7. The process of claim 1 wherein said gate electrode contains scandium at 0.1 to 0.3% by weight.

8. A process for fabricating a thin film transistor comprising:
   a first step of forming a gate insulating film on the surface of an active region formed on the substrate;
   a second step of forming a first coating which is capable of being anodically oxidized on the gate insulating film, and forming further on said first coating a second coating which provides a masking material;
   a third step of patterning said first and said second coating to form a gate electrode and the masking material on said gate electrode;
   a fourth step of forming a porous anodic oxide on a side of the gate electrode with the masking material by applying a current to said gate electrode;
   a fifth step of applying a current to the gate electrode to form a pore-free anodic oxide on at least an upper side of the gate electrode after removing the masking material; and
   a sixth step of introducing an impurity into the active region by using the anodic oxide and the gate electrode obtained in at least one of the fourth and fifth step above as the masks.

9. A process for fabricating a thin film transistor comprising:
   a first step of forming a gate insulating film on the surface of an active region formed on the substrate;
   a second step of forming a first coating which is capable of being anodically oxidized on the gate insulating film, and forming further on said first coating a second coating which provides a masking material;
   a third step of patterning said first and said second coating to form a gate electrode and the masking material on said gate electrode;
   a fourth step of forming a porous anodic oxide on a side of the gate electrode with the masking material by applying a current to said gate electrode;
   a fifth step of applying a current to the gate electrode to form a pore-free anodic oxide on at least an upper side of the gate electrode after removing the masking material;
   a sixth step of introducing an impurity into the active region by using the anodic oxide and the gate electrode obtained in at least one of the fourth and fifth step above as the masks; and
   a seventh step of removing said porous anodic oxide.

* * * * *